US006942957B2

(12) United States Patent
Ray et al.

(10) Patent No.: US 6,942,957 B2
(45) Date of Patent: Sep. 13, 2005

(54) IONIC LIQUIDS AS DEVELOPABILITY ENHANCING AGENTS IN MULTILAYER IMAGEABLE ELEMENTS

(75) Inventors: Kevin B. Ray, Fort Collins, CO (US); S. Peter Pappas, Juno Beach, FL (US); John Kalamen, Loveland, CO (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 10/621,640

(22) Filed: Jul. 17, 2003

(65) Prior Publication Data

US 2005/0014644 A1 Jan. 20, 2005

(51) Int. Cl.[7] .......................... G03F 7/039; G03F 7/11; G03F 7/30

(52) U.S. Cl. ............................... 430/271.1; 430/276.1; 430/302; 430/326; 430/330; 430/964

(58) Field of Search .......................... 430/271.1, 276.1, 430/302, 326, 330, 964

(56) References Cited

U.S. PATENT DOCUMENTS

| | | | | | |
|---|---|---|---|---|---|
| 5,827,602 | A | | 10/1998 | Koch et al. | |
| 6,048,388 | A | | 4/2000 | Schwarz | |
| 6,083,663 | A | * | 7/2000 | Vermeersch et al. | 430/302 |
| 6,280,899 | B1 | | 8/2001 | Parsons et al. | |
| 6,294,311 | B1 | | 9/2001 | Shimazu et al. | |
| 6,352,811 | B1 | | 3/2002 | Patel et al. | |
| 6,352,812 | B1 | | 3/2002 | Shimazu et al. | |
| 6,358,669 | B1 | | 3/2002 | Savariar-Hauck et al. | |
| 6,528,228 | B2 | | 3/2003 | Hauck et al. | |
| 6,531,270 | B1 | | 3/2003 | Olson et al. | |
| 6,531,273 | B1 | | 3/2003 | Olson et al. | |
| 6,586,166 | B1 | * | 7/2003 | Olson et al. | 430/350 |
| 6,593,055 | B2 | | 7/2003 | Shimazu et al. | |

FOREIGN PATENT DOCUMENTS

| | | | |
|---|---|---|---|
| EP | 0908307 | A2 | 4/1999 |
| EP | 0908784 | A1 | 4/1999 |
| EP | 0922570 | A2 | 6/1999 |
| EP | 1023994 | A1 | 8/2000 |
| EP | 1052113 | A1 | 11/2000 |
| EP | 0864420 | B1 | 5/2001 |
| EP | 0908305 | B1 | 11/2001 |
| EP | 0950518 | B1 | 1/2002 |
| EP | 0908779 | B1 | 6/2002 |
| EP | 0940266 | B1 | 6/2002 |
| EP | 0960728 | B1 | 5/2003 |
| EP | 0909657 | B1 | 6/2003 |
| JP | 2000-355178 | | 12/2000 |

OTHER PUBLICATIONS

Holbrey et al, Green Industrial Applications of Ionic Liquids: Technology Review, Center for Green Manufacturing and Department of Chemistry, U of Alabama, 2003, pp. 1–14.

Martin, J.D., Structure Property Relationships in Ionic Liquids, Department of Chemistry, North Carolina State University, 2001, pp. 1–14.

Visser et al, Characterization of Hydrophilic and Hydrophobic Ionic Liquids: Alternatives to VOC's for Liquid–Liquid Separations, Department of Chemistry and Center for Green Manufacturing, U of Alabama, 2002, 20 pgs.

Johnson et al, Significance of Cations in Ionic Liquids Chemistry, Department of Chemistry and Biochemistry, U of Regina, 2001, pp. 1–13.

Wilkes, J.S., Ionic Liquids in Perspective: The Past with an Eye Toward the Industrial Future, Department of Chemistry, U.S. Air Force Academy, 2003, pp. 1–16.

Earle, M.J., Ionic Liquids: Solvents for the 21$^{st}$ Century, The Quill Centre, The Queen's University of Belfast, 2001, pp. 1–17.

Scott et al, Application of Ionic Liquids as Plasticizers for Poly(Methyl Methacrylate), Chem. Commun., 2002, pp. 1370–1371.

* cited by examiner

*Primary Examiner*—Richard L. Schilling
(74) *Attorney, Agent, or Firm*—RatnerPrestia

(57) ABSTRACT

Thermally imageable, positive working, multilayer imageable elements useful as lithographic printing plate precursors are disclosed. The elements comprise a substrate; an underlayer over the substrate; a top layer over the underlayer, and a photothermal conversion material. The top layer comprises a binder and an ionic liquid. A preferred binder is poly (methyl methacrylate).

24 Claims, No Drawings

IONIC LIQUIDS AS DEVELOPABILITY ENHANCING AGENTS IN MULTILAYER IMAGEABLE ELEMENTS

FIELD OF THE INVENTION

This invention relates to thermally imageable elements. More particularly, this invention relates to multi-layer imageable elements that contain ionic liquids as developability enhancing agents.

BACKGROUND OF THE INVENTION

In conventional lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise a top layer applied over the hydrophilic surface of a substrate. The top layer typically comprises one or more radiation-sensitive components, which may be dispersed in a suitable binder. Alternatively, the radiation-sensitive component can also be the binder material. If, after imaging, the imaged regions are removed in the developing process revealing the underlying hydrophilic surface of the substrate, the precursor is positive working. Conversely, if the unimaged regions are removed, the precursor is negative-working. In each instance, the regions that remain (i.e., the image areas) are ink-receptive, and the regions of the hydrophilic surface revealed by the developing process accept water and aqueous solutions, typically a fountain solution, and repel ink.

Imaging with ultraviolet and/or visible radiation is typically carried out through a mask, which has clear and opaque regions. Imaging takes place in the regions under the clear regions of the mask but does not occur in the regions under the opaque regions. If corrections are needed in the final image, a new mask must be made. This is a time-consuming process. In addition, the dimensions of the mask may change slightly due to changes in temperature and humidity. Thus, the same mask, when used at different times or in different environments, may give different results and could cause registration problems.

Direct digital imaging of imageable elements, which obviates the need for imaging through a mask, is becoming increasingly important in the printing industry. Positive working, thermally imageable, multi-layer elements are disclosed, for example, in Shimazu, U.S. Pat. No. 6,294,311, and U.S. Pat. No. 6,352,812; Patel, U.S. Pat. No. 6,352,811; and Savariar-Hauck, U.S. Pat. No. 6,358,669, and U.S. Pat. No. 6,528,228; the disclosures of which are all incorporated herein by reference.

However, in the preparation of multi-layer imageable elements, it is typically necessary to coat a top layer over an underlayer. To prevent the underlayer from dissolving in the coating solvent for the top layer and mixing with the top layer when the top layer is coated over the underlayer, care must be taken in selecting the components used in the top layer, the underlayer, and the coating solvent for the top layer. However, mixing of the layers, which can cause ablation of the top layer during imaging, may occur. In addition, the need to use ingredients in the underlayer that will not dissolve in the coating solvent for the top layer and the need to use coating solvents for the top layer that will not dissolve the underlayer, limit available formulation choices.

Poly(methyl methacrylate) and copolymers of methyl methacrylate are excellent top layers for multilayer imageable elements. Poly(methyl methacrylate) is very unpenetrable to many developers in the unexposed regions. It is typically soluble in solvents in which the underlayer ingredients are insoluble, so that layer intermixing does not occur during preparation of the imageable element. However, poly(methyl methacrylate) from the imaged regions may leave residual "skins" of poly(methyl methacrylate) throughout the development tank of a processor, which may block the pipes and pumps of the processor and/or re-deposit on the non-image regions of the developed printing plate. Thus, a need exists to improve the developability of multilayer imageable elements that contain poly(methyl methacrylate) and/or copolymers of methyl methacrylate in the top layer.

SUMMARY OF THE INVENTION

In one aspect, the invention is an imageable element comprising:

a substrate;

an underlayer over the substrate; and a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the top layer comprises a binder and an ionic liquid;

the binder is selected from the group consisting of poly(methyl methacrylate); copolymers of methyl methacrylate with other acrylate or methacrylate monomers; polystyrene; copolymers of styrene with acrylate and methacrylate monomers; polyesters, polyamides, polyureas, polyurethanes, epoxy resins, and combinations thereof; and the underlayer is removable by the aqueous alkaline developer.

A preferred binder is poly(methyl methacrylate).

In another aspect, the invention is a method for forming an image by imaging and developing the imageable element.

DETAILED DESCRIPTION OF THE INVENTION

Unless the context indicates otherwise, in the specification and claims, the terms ionic liquid, binder, polymeric material, photothermal conversion material, coating solvent, and similar terms include mixtures of such materials. Unless otherwise specified, all percentages are percentages by weight. Thermal imaging refers to imaging either with a hot body or with an infrared laser.

Imageable Element

The imageable element comprises a substrate, an underlayer over the substrate, and a top layer over the underlayer.

A photothermal conversion material is present, either in the underlayer and/or in a separate absorber layer.

Top Layer

The top layer is ink receptive. Before thermal imaging, it is not removable by an aqueous alkaline developer so that the unimaged regions of the top layer are not removed by the developing process. After thermal imaging, the imaged regions of the top are removable by the aqueous alkaline developer so that a positive image is formed.

The top layer comprises a binder and an ionic liquid. Polymers useful as binders in the top layer include, acrylate and methacrylate polymers and copolymers, such as poly (methyl methacrylate), copolymers of methyl methacrylate with monomers such as methyl acrylate, ethyl acrylate, ethyl methacrylate, propyl acrylate, propyl methacrylate, hydroxyethyl acrylate, hydroxyethyl methacrylate, butyl acrylate, and butyl methacrylate; polystyrene; copolymers of styrene with acrylate and methacrylate monomers such as those listed above; polyesters, polyamides, polyureas, polyurethanes, epoxy resins, and combinations thereof. Preferred binders include acrylic and methacrylic polymers and copolymers, such as copolymers of methyl methacrylate with other acrylate and methacrylate monomers; polystyrene; and copolymers of styrene with acrylate and methacrylate monomers, such as methyl methacrylate/styrene copolymers. A most preferred binder is poly(methyl methacrylate).

The top layer also comprises an ionic liquid or a mixture of ionic liquids. While not being bound by any theory or explanation, it is believed that the ionic liquid acts as a plasticizer and plasticizes the binder. Ionic liquids are salts with melting points under 100° C. Ionic liquids with melting points less than 70° C., less than 50° C., less than 30° C., less than 20° C., and/or less than 0° C. can be used to advantage in the imageable elements of the invention.

Typical ionic liquids have an organic cation and an anion that may be either organic or inorganic. Typical organic cations are imidazolium cations, pyridinium cations, pyrrolidinium cations, phosphonium cations, and tetralkylammonium cations. Preferred cations are imidazolium cations, such as 1,3-dimethylimidazolium, 1-ethyl-3-methylimidazolium, 1,2-dimethyl-3-propylimidazolium, 1-ethyl-2,3-dimethylimidazolium, 1-butyl-3-methylimidazolium, 1-hexyl-3-methylimidazolium, and 1-methyl-3-octylimidazolium; and pyridinium cations, such as 1-butyl4-methylpyridinium. Typical anions are methylsulfonate, trifluoromethylsulfonate, bromide, chloride, nitrate, tetrafluoroborate, hexafluorophosphate, methylsulfate, and bromotrichloroaluminate. Hydrophobic ionic liquids are disclosed, for example, in Koch, U.S. Pat. No. 5,827,602, incorporated herein by reference. The hydrophobic ionic liquids have non-Lewis acid-containing polyatomic anions in which the van der Waals volume exceeds 100 Å$^3$, such as bis(trifluoromethylsulfonyl)imide, bis (pentafluoroethylsulfonyl)imide, tris (trifluoromethylsulfonyl)methide, bis (pentafluoroethylsulfonyl)imide, and perfluoro-1,1-dimethylpropyl alkoxide.

Numerous ionic liquids are known to those skilled in the art. Typical ionic liquids include, for example, 1,3-dimethylimidazolium methylsulfate (DiMIM $MeSO_4$), 1,2-dimethyl-3-propylimidazolium tris(trifluoromethylsulfonyl) methide, 1-ethyl-3-methylimidazolium bromide, 1-ethyl-3-methylimidazolium chloride, 1-ethyl-3-methylimidazolium hexafluorophosphate, 1-ethyl-3-methylimidazolium nitrate, 1-ethyl-3-methyl imidazolium tetrafluoroborate, 1-ethyl-3-methyl imidazolium trifluoromethylsulfonate, 1-ethyl-3-methylimidazolium bis(trifluoromethylsulfonyl)imide (EMI Im), 1-ethyl-3-methylimidazolium bis (pentafluoroethylsulfonyl)imide, 1-ethyl-2,3-dimethylimidazolium chloride, 1-butyl-3-methylimidazolium bromide, 1-butyl-3-methylimidazolium chloride (BMIM Cl), 1-ethyl-2,3-dimethylimidazolium tosylate (EDiMIM TOS), 1-butyl-3-methylimidazolium methylsulfate, 1-butyl-3-methylimidazolium hexafluorophosphate (BMIM $PF_6$), 1-butyl-3-methylimidazolium diethyleneglycol monomethylether sulfate, N-propyl-3-methylpyridinium bis(trifluoromethylsulfonyl)imide, 1-butyl-3-methylimidazolium tetrafluoroborate (BMIM $BF_4$), 1-butyl-3-methylimidazolium bromotrichloroaluminate, 1-butyl-3-methylimidazolium diethyleneglycol monomethylether sulfate (BMIM $MDEGSO_4$), 1-butyl-3-methylimidazolium phosphate, 1-butyl-3-methylimidazolium octylsulfate (BMIM $OcSO_4$), 1-butyl-2,3-dimethylimidazolium chloride, N-butyl-3-methylpyridinium bis(trifluoromethylsulfonyl)imide, 1-hexyl-3-methylimidazolium chloride, 1-hexyl-3-methylimidazolium hexafluorophosphate, 1-hexyl-3-methylimidazolium tetrafluoroborate, 1-hexyl-2,3-dimethylimidazolium chloride, 1-octyl-3-methylimidazolium chloride, 1-decyl-3-methylimidazolium chloride, 1-methyl-3-octylimidazolium chloride, 1-methyl-3-octylimidazolium diethyleneglycol monomethylether sulfate (OMIM $MDEGSO_4$), 1-methyl-3-octylimidazolium octylsulfate (OMIM $OcSO_4$), 1-methyl-3-octylimidazolium tetrafluoroborate (OMIM $BF_4$), 1-octadecyl-3-methylimidazolium chloride, 1-butyl-4-methylpyridinium chloride, 1-butyl-4-methylpyridinium hexafluorophosphate, 1-butyl-4-methylpyridinium tetrafluoroborate, N-octyl-pyridinium tris(trifluoromethylsulfonyl)methide, N-hexyl-pyridinium tetrafluoroborate, 4-methyl-N-butyl-pyridinium chloride, N-hexyl-pyridinium bis(trifluoromethylsulfonyl) imide, 1-butyl-1-methyl-pyrrolidinium chloride, 1,1-dimethyl-pyrrolidinium tris(pentafluoroethyl) trifluorophosphate, 1-hexyl-1-methyl-pyrrolidinium dicyanamide, 1-octyl-1-methyl-pyrrolidinium chloride, tetramethyl-ammonium bis(trifluoromethyl)imide, tetrabutyl-ammonium bis(trifluoromethyl)imide, tetraethyl-ammonium tris(pentafluoroethyl)trifluorophosphate, and tetrabutyl-phosphonium tris(pentafluoroethyl) trifluorophosphate.

The top layer typically consists essentially of the binder and the ionic liquid, but other ingredients may be present. Surfactants may be present as, for example, coating aids. A dye may be present to aid in the visual inspection of the imaged and/or developed element. Printout dyes distinguish the imaged regions from the unimaged regions during processing. Contrast dyes distinguish the unimaged regions from the imaged regions in the developed imageable element. If present, the dye should not absorb the imaging radiation.

The ionic liquid typically comprises about 1 wt % to about 20 wt %, typically about 1 wt % to about 10 wt %, more typically about 2 wt % to 5 wt %, of the top layer, based on the dry weight of the top layer. Typically, the top layer has a coating weight of about 0.5 to about 4 g/m$^2$, preferably 0.8 to 3 g/m$^2$.

Underlayer

The underlayer is between the hydrophilic surface of the substrate and the top layer. After imaging, it is removed by the developer in the imaged regions to reveal the underlying hydrophilic surface of the substrate. The polymeric material in the underlayer is preferably soluble in the developer to prevent sludging of the developer. In addition, it is preferably insoluble in the solvent used to coat the top layer so that the top layer can be coated over the underlayer without dissolving the underlayer.

Polymeric materials useful in the underlayer include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, the disclosure of which is incorporated herein by reference.

Particularly useful polymeric materials for the underlayer are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in a methyl lactate/methanol/dioxolane (15:42.5:42.5 wt %) mixture, which can be used as the coating solvent for the underlayer. However, they are poorly soluble in solvents such as acetone, methyl ethyl ketone, diethyl ketone, and toluene, which can be used as solvents to coat the top layer on top of the underlayer without dissolving the underlayer.

Other useful polymeric materials include those that comprise a monomer that has a urea bond in its side chain (i.e., a pendent urea group), such as are disclosed in Ishizuka, U.S. Pat. No. 5,731,127. These copolymers comprise about 10 to 80 wt %, preferably about 20 to 80 wt %, of one or more monomers represented by the general formula:

$$CH_2{=}C(R){-}CO_2{-}X{-}NH{-}CO{-}NH{-}Y{-}Z,$$

in which R is —H or —$CH_3$; X is a bivalent linking group; Y is a substituted or unsubstituted bivalent aromatic group; and Z is —OH, —COOH, or —$SO_2NH_2$.

A useful monomer is:

$$CH_2{=}C(CH_3){-}CO_2{-}CH_2CH_2{-}NH{-}CO{-}NH\text{-p-}C_6H_4\text{-}Z,$$

in which Z is —OH, —COOH, or —$SO_2NH_2$, preferably —OH.

The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides.

Another group of polymeric materials that are useful in the underlayer include copolymers that comprise about 10 to 90 mol % of a sulfonamide monomer unit, especially those that comprise N-(p-aminosulfonylphenyl)-methacrylamide, N-(m-aminosulfonylphenyl)methacrylamide, N-(o-aminosulfonylphenyl)methacrylamide, and/or the corresponding acrylamide. Useful materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate.

Combination of (1) a copolymer that comprises N-substituted maleimides, especially N-phenylmaleimide; methacrylamides, especially methacrylamide; and acrylic and/or methacrylic acid, especially methacrylic acid with (2) a copolymer that comprises a urea in its side chain or with a copolymer that comprises 10 to 90 mol % of a sulfonamide monomer unit, especially one that comprises N-(p-aminosulfonylphenyl)methacrylamide, N-(m-aminosulfonylphenyl)-methacrylamide, N-(o-aminosulfonylphenyl)methacrylamide, and/or the corresponding acrylamide, can be used. One or more other polymeric materials, such as novolac resins, may also be present in the combination. Preferred other polymeric materials, when present, are novolac resins.

Alternatively, underlayer may comprise a negative working imageable composition that comprises a polymeric diazonium compound and a polymeric material. Typically, the polymeric diazonium compound is a diazonium polycondensation product. Diazonium polycondensation products are well known to those skilled in the art. They may be prepared, for example, by condensation of a diazo monomer, such as is described in Toyama, U.S. Pat. No. 4,687,727, with a condensation agent, such as formaldehyde, acetaldehyde, propionaldehyde, butyraldehyde, isobutyraldehyde or benzaldehyde. Mixed condensation products that comprise units derived from condensable compounds, in particular from aromatic amines, phenols, phenol ethers, aromatic thioethers, aromatic hydrocarbons, aromatic heterocycles or organic acid amides may be used. Especially advantageous examples of diazonium polycondensation products are the reaction products of diphenylamine-4-diazonium salts, optionally having a methoxy group in the phenyl group bearing the diazo group, with formaldehyde or 4,4'-bis-methoxymethyl diphenyl ether. Aromatic sulfonates such as 4-tolylsulfonate or mesitylene sulfonate, tetrafluoroborate, hexafluorophosphate, hexafluoroantimonate, and hexafluoroarsenate are particularly suitable as anions of these diazo resins. The diazonium polycondensation product preferably comprises about 3 to about 60 wt % of the underlayer.

Numerous polymeric materials that can be used with diazonium compounds are known. One such system is described in Baumann, U.S. Pat. No. 5,700,619. The polymeric material is an acetalized polyvinyl alcohol (polymeric acetal resin), with pendent carboxyl groups. These polymeric materials may be produced by reaction of polyvinyl alcohol with aldehydes such as acetaldehyde, propanaldehyde, and/or butyraldehyde, and with 4-carboxybenzaldehyde. Polymeric materials that additionally comprise about 0.01 to about 2 mol % of a free radical polymerization-inhibiting vinyl acetal unit, such as may be produced by reaction of the polymeric material with 3,5-di-t-butyl-4-hydroxybenzaldehyde; 3,5-d-t-butyl-2-hydroxybenzaldehyde; 3-t-butyl-2-hydroxybenzaldehyde; 5-t-butyl-2-hydroxybenzaldehyde; 4-t-butyl-2,6-diformylphenol; 2-hydroxy-5-methoxybenzaldehyde; 2,4-dihydroxybenzaldehyde; 2,5-dihydroxybenzaldehyde; 2-hydroxy-4-methylbenzaldehyde; 2-hydroxy-4-methoxybenzaldehyde; 3,4-dihydroxybenzaldehyde; 2,3,4-trihydroxybenzaldehyde; 2,4,5-trihydroxybenzaldehyde; or 2,4,6-trihydroxybenzaldehyde, may also be useful for producing compositions with longer shelf life. These polymeric materials are described U.S. patent application Ser. No. 10/117,505, filed Apr. 5, 2002.

Photothermal Conversion Material

Imageable elements that are to $b^-$ imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads. To prevent sludging of the developer by insoluble material, photothermal conversion materials that are soluble in the developer are preferred.

The photothermal conversion material may be, for example, an indoaniline dye, an oxonol dye, a porphyrin derivative, an anthraquinone dye, a merostyryl dye, a pyrylium compound, or a squarylium derivative with the appropriate absorption spectrum and solubility. Dyes, especially dyes with a high extinction coefficient in the range of 750 nm to 1200 nm, are preferred. Absorbing dyes are disclosed in numerous publications, for example, Nagasaka, EP 0,823, 327; DeBoer, U.S. Pat. No. 4,973,572; Jandrue, U.S. Pat. No. 5,244,771; and Chapman, U.S. Pat. No. 5,401,618. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), as well as IR Dye A, and IR Dye B, whose structures are shown below.

IR Dye A

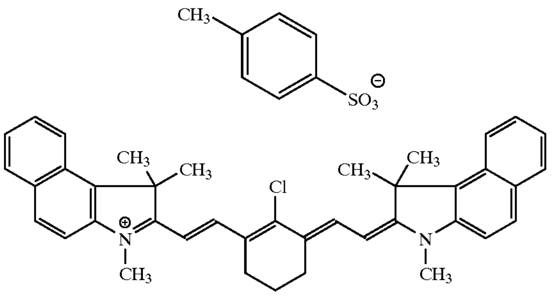

IR Dye B

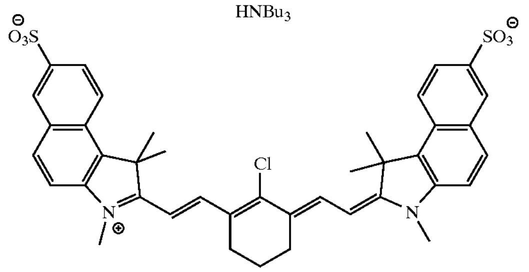

Other useful photothermal conversion materials include infrared absorbers of Structure I, Structure II, and Structure III. These photothermal conversion materials absorb in two different regions of the infrared spectrum so elements that comprise these materials can be imaged with imaging devices that contain lasers that emit either at about 830 nm, at about 1056 nm, or at about 1064 nm. These materials are described U.S. patent application Ser. No. 10/409,301, filed Apr. 7, 2003.

STRUCTURE I

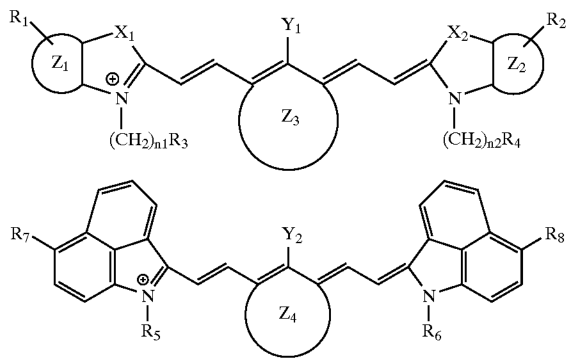

STRUCTURE II

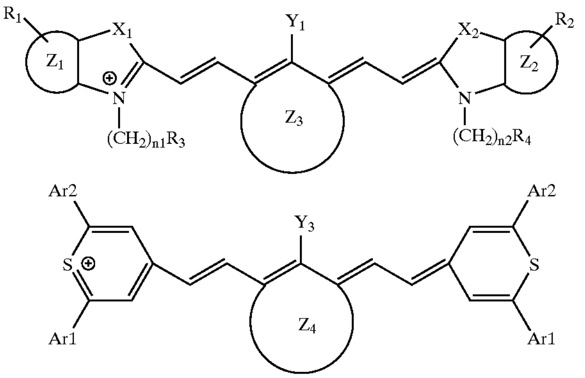

STRUCTURE III

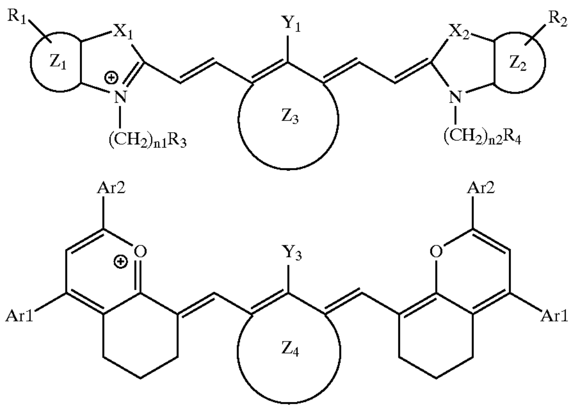

in which:

$Y_1$, $Y_2$, and $Y_3$ are each independently hydrogen, halo, alkyl, phenyl, substituted phenyl, phenylamino, diphenylamino, or phenylthio, preferably phenyl, hydrogen, chloro, phenylthio, or diphenylamino;

$R_1$, $R_2$, $R_3$, and $R_4$ are each independently hydrogen, alkyl, preferably methyl or ethyl, or $SO_3^-$, with the proviso that two of $R_1$, $R_2$, $R_3$, and $R_4$ are $SO_3^-$;

$R_5$ and $R_6$ are each independently alkyl, aryl, aralkyl, hydroxyalkyl, alkoxyalkyl, aminoalkyl, carboxyalkyl, or sulfoalkyl;

$R_7$ and $R_8$ are each independently hydrogen, alkyl, preferably alkyl of one to four carbon atoms, or halo, preferably chloro;

$Ar_1$ and $Ar_2$ are each independently phenyl or substituted phenyl, preferably phenyl;

$Z_1$, and $Z_2$ are each independently a benzo group or a naphtho group;

$Z_3$ and $Z_4$ are each independently two hydrogen atoms, a cyclohexene residue, or a cyclopentene residue;

$X_1$ and $X_2$ are each independently S, O, NH, $CH_2$, or, preferably, $C(CH_3)_2$; and $n_1$ and $n_2$ are each independently 0 to 4, preferably 1 to 4.

Infrared absorbers of Structure I, Structure II, or Structure III may be prepared by mixing a solution of a salt that contains the desired cation with a solution of a salt that contains the desired anion and filtering off the resulting precipitate. The anion of the salt that contains the desired cation is typically, for example, a sulfate, bisulfate, or halide, such as chloride or bromide. The cation of the salt that contains the desired anion is typically ammonium, substituted ammonium such as trimethyl ammonium or tri-n-butyl ammonium, lithium, sodium, or potassium. The solvent may be water or a solvent including a mixture of water and a hydrophilic solvent such an as alcohol, for example methanol, ethanol, or propylene glycol methyl ether.

To prevent ablation during imaging with infrared radiation, the top layer is substantially free of photothermal conversion material. That is, the photothermal conversion material in the top layer, if any, absorbs less than about 10% of the imaging radiation, preferably less than about 3% of the imaging radiation, and the amount of imaging radiation absorbed by the top layer, if any, is not enough to cause ablation of the top layer.

The amount of infrared absorber is generally sufficient to provide an optical density of at least 0.05, and preferably, an optical density of from about 0.5 to at least about 2 to 3 at the imaging wavelength. As is well known to those skilled in the art, the amount of compound required to produce a particular optical density can be determined from the thickness of the underlayer and the extinction coefficient of the infrared absorber at the wavelength used for imaging using Beer's law. When the infrared absorber is present in the underlayer, infrared absorber typically comprises about 0.1 to 20% by weight, more preferably about 0.5 to 10% by weight, of the underlayer, based on the total weight of the underlayer.

Other Layers

When an absorber layer is present, it is between the top layer and the underlayer. The absorber layer preferably consists essentially of the infrared absorber and, optionally, a surfactant. It may be possible to use less of the infrared absorber if it is present in a separate absorber layer. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$.

To further minimize migration of the infrared absorber from the underlayer to the top layer during manufacture and storage of the imageable element, the element may comprise a barrier layer between the underlayer and the top layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

Substrates

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically about 100 $\mu$m to about 600 $\mu$m. Typically, the substrate comprises an interlayer between the aluminum support and the layer of imageable composition. The interlayer may be formed by treatment of the support with, for example, silicate, dextrine, hexafluorosilicic acid, phosphate/fluoride, polyvinyl phosphonic acid (PVPA) or vinyl phosphonic acid copolymers.

The back side of the substrate (i.e., the side opposite the underlayer and top layer) may be coated with an antistatic agent and/or a slipping layer or matte layer to improve handling and "feel" of the imageable element.

Preparation of the Imageable Elements

The imageable element may be prepared by sequentially applying the underlayer over the hydrophilic surface of the substrate; applying the absorber layer or the barrier layer if present, over the underlayer; and then applying the top layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating.

When neither a barrier layer nor an absorber layer is present, the top layer is coated on the underlayer. To prevent the underlayer from dissolving and mixing with the top layer, the top layer should be coated from a solvent in which the underlayer layer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. An intermediate drying step, i.e., drying the underlayer, if present, to remove coating solvent before coating the top layer over it, may also be used to prevent mixing of the layers.

Alternatively, the underlayer, the top layer or both layers may be applied by conventional extrusion coating methods from a melt mixture of layer components. Typically, such a melt mixture contains no volatile organic solvents.

Imaging and Processing

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the Creo Trendsetter (CREO, Burnaby, British Columbia, Canada), the Screen PlateRite model 4300 and model 8600 (Screen, Rolling Meadows, Chicago, Ill., USA), and the Gerber Crescent 42T (Gerber, Brussels, Belgium).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers the GS618-400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged regions and complementary unimaged regions. Development of the imaged element to form a printing plate, or printing form, converts the latent image to an image by removing the imaged regions, revealing the hydrophilic surface of the underlying substrate.

Suitable developers depend on the solubility characteristics of the ingredients present in the imageable element. The developer may be any liquid or solution that can penetrate and remove the imaged regions of the imageable element without substantially affecting the complementary unimaged regions. While not being bound by any theory or explanation, it is believed that image discrimination is based on a kinetic effect. The imaged regions of the top layer are removed more rapidly in the developer than the unimaged regions. Development is carried out for a long enough time to remove the imaged regions of the top layer and the underlying regions of the other layer or layers of the element, but not long enough to remove the unimaged regions of the top layer. Hence, the top layer is described as being "not removable" by, or "insoluble" in, the developer prior to imaging, and the imaged regions are described as being "soluble" in, or "removable" by, the developer because they are removed, i.e. dissolved and/or dispersed, more rapidly in the developer than the unimaged regions. Typically, the underlayer is dissolved in the developer and the top layer is dissolved and/or dispersed in the developer.

High pH developers can be used. High pH developers typically have a pH of at least about 11, more typically at least about 12, even more typically from about 12 to about 14. High pH developers also typically comprise at least one alkali metal silicate, such as lithium silicate, sodium silicate, and/or potassium silicate, and are typically substantially free of organic solvents. The alkalinity can be provided by using a hydroxide or an alkali metal silicate, or a mixture. Preferred hydroxides are ammonium, sodium, lithium and, especially, potassium hydroxides. The alkali metal silicate has a $SiO_2$ to $M_2O$ weight ratio of at least 0.3 (where M is the alkali metal), preferably this ratio is from 0.3 to 1.2, more preferably 0.6 to 1.1, most preferably 0.7 to 1.0. The amount of alkali metal silicate in the developer is at least 20 g $SiO_2$ per 100 g of composition and preferably from 20 to 80 g, most preferably it is from 40 to 65 g. High pH developers can be used in an immersion processor. Typical high pH developers include PC9000, PC3000, Goldstar™, Greenstarm, ThermalPro™, PROTHERM®, MX 1813, and MX1710, aqueous alkaline developers, all available from Kodak Polychrome Graphics LLC, Norwalk, Conn., USA.

The imageable elements can also be developed using a solvent based developer in an immersion processor or a spray on processor. Solvent based alkaline developers comprise an organic solvent or a mixture of organic solvents and are typically silicate free. The developer is a single phase. Consequently, the organic solvent or mixture of organic solvents must be either miscible with water or sufficiently soluble in the developer that phase separation does not occur. The following solvents and mixtures thereof are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer. Typical commercially available solvent based developers include 956 Developer, 955 Developer and SP200, all available from Kodak Polychrome Graphics.

Commercially available spray on processors include the 85 NS (Kodak Polychrome Graphics). Commercially available immersion processors include the Mercury Mark V processor (Kodak Polychrome Graphics); the Global Graphics Titanium processor (Global Graphics, Trenton, N.J., USA); and the Glunz and Jensen Quartz 85 processor (Glunz and Jensen, Elkwood, Va., USA).

Following development, the resulting printing plate is rinsed with water and dried. Drying may be conveniently carried out by infrared radiators or with hot air. After drying, the printing plate may be treated with a gumming solution comprising one or more water-soluble polymers, for example polyvinylalcohol, polymethacrylic acid, polymethacrylamide, polyhydroxyethylmethacrylate, polyvinylmethylether, gelatin, and polysaccharide such as dextrine, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of about 120° C. for about 30 min.

INDUSTRIAL APPLICABILITY

The imageable elements are useful in photomask lithography, imprint lithography, microelectronic and microoptical devices, photoresists for the preparation of printed circuit boards, and especially as lithographic printing plate precursors. Once a lithographic printing plate precursor has been imaged and developed to form a lithographic printing plate or printing form, printing can then be carried out by applying a fountain solution and then lithographic ink to the image on its surface. The fountain solution is taken up by the unimaged regions, i.e., the surface of the hydrophilic substrate revealed by the imaging and development process, and the ink is taken up by the imaged regions, i.e., the regions of the layer of imageable composition not removed by the development process. The ink is then transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

In the Examples, “coating solution” refers to the mixture of solvent or solvents and additives coated, even though some of the additives may be in suspension rather than in solution. Except where indicated, the indicated percentages are percentages by weight based on the total solids in the coating solution.

| Glossary | |
|---|---|
| 956 Developer | Solvent-based (phenoxyethanol) alkaline developer (Kodak Polychrome Graphics, Norwalk, CT, USA) |
| ACRYLOID ® A-21 | Poly(methyl methacrylate), at 30% w/w in toluene/butanol (90:10; w:w) (Rohm and Haas, Philadelphia, PA, USA) |
| BMIM $BF_4$ | 1-Butyl-3-methylimidazolium tetrafluoroborate (Strem, Newburyport, MA, USA) (mp −75° C.) |
| BMIM $OcSO_4$ | 1-Butyl-3-methylimidazolium octylsulfate (Strem, Newburyport, MA, USA) |
| BMIM $PF_6$ | 1-Butyl-3-methylimidazolium hexafluorophosphate (Strem Chemicals, Newburyport, MA, USA) |
| Creo Trendsetter 3230 | Commercially available platesetter, using Procom Plus software, operating at a wavelength of 830 nm (Creo Products Inc., Burnaby, BC, Canada) |
| DiMIM $MeSO_4$ | 1,3-Dimethylimidazolium methylsulfate (Strem Chemicals, Newburyport, MA, USA) |
| EMI Im | 1-Ethyl-3-methylimidazolium bis(trifluoromethyl-sulfonyl) imide (Strem, Newburyport, MA, USA) |
| EDiMIM TOS | 1-Ethyl-2,3-dimethylimidazolium tosylate (Strem, Newburyport, MA, USA) |
| Goldstar ™ Developer | Sodium metasilicate based aqueous alkaline developer (Kodak Polychrome Graphics, Norwalk, CT, USA) |
| IR Dye A | Infrared absorbing dye ($lambda_{max}$ = 830 nm) (see structure above) (Eastman Kodak, Rochester, NY, USA) |
| Nega 107 | Negative diazo resin derived from condensation of 3-methoxy-diphenylamine-4-diazonium sulfate and 4,4'-bis-methoxymethyldiphenylether, isolated as mesitylene sulfonate salt (see structure below) (Panchim, Lisses, France) |
| OMIM $BF_4$ | 1-Methyl-3-octylimidazolium tetrafluoroborate (Strem, Newburyport, MA, USA) (mp −88° C.) |
| OMIM $MDEGSO_4$ | 1-Methyl-3-octylimidazolium diethyleneglycol monomethylether sulfate (Strem, Newburyport, MA, USA) |

-continued

| Glossary | |
|---|---|
| PD-140A | Cresol/formaldehyde novolac resin (75:25 m-cresol/-p-cresol) (Borden Chemical, Columbus, OH, USA) |
| Substrate A | 0.3 gauge, aluminum sheet, electrograined, anodized and treated with an aqueous solution of an inorganic phosphate |
| T71 Resin | Functionalized polyvinyl alcohol, believed to have the structure shown below (Freundorfer GmbH, Munich, Germany) |

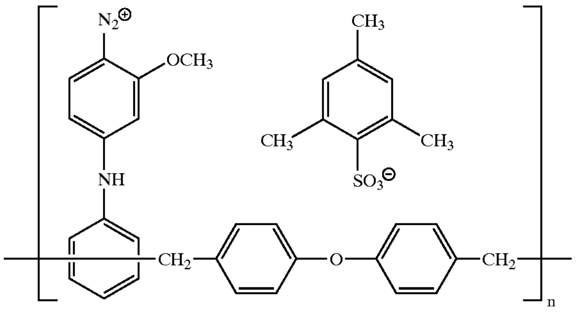

Nega 107

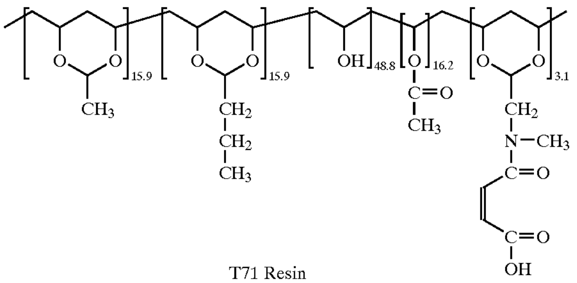

T71 Resin

Examples 1 to 3

PD 140A (90 parts by weight) and IR Dye A (10 parts by weight) were dissolved in 1-methoxypropan-2-ol. The resulting coating solution was coated onto the Substrate A using a wire wound bar. The resulting element, consisting of an underlayer on a support, was dried at 100° C. for 90 seconds in a Mathis Labdryer oven. The dry coating weight of the resulting underlayer was 1.8 g/m$^2$.

The ingredients listed in Table 1 were dissolved in toluene, and the resulting coating solution was coated on the underlayer using a wire wound bar. The resulting elements were dried at 100° C. for 90 seconds in the Mathis Labdryer oven. The dry coating weight of the resulting layers was 1.0 g/m$^2$.

TABLE 1

| | Example | | |
|---|---|---|---|
| | 1 | 2 | 3 |
| Component | Parts by Weight | | |
| ACRYLOID ® A-21 | 100 | 98 | 95 |
| BMIM $PF_6$ | — | 2 | 5 |

The resulting imageable elements were imaged with a 50% screen test pattern using the Creo Trendsetter at imaging densities of 250, 205, 170, 150, 130 and 90 mJ/cm$^2$ (corresponding to laser power of 10 Watts and drum speeds of 90, 110, 130, 150, 175 and 250 rpm). The imaged imageable elements were developed using a Mercury Mark V processor (immersion type processor Kodak Polychrome Graphics, Norwalk, Conn., USA) containing Goldstar™ Developer at 23.8° C. Processing was carried out at 500 and 1500 mm/min. The resulting images were analyzed using a Gretag D19C Densitometer (Colour Data Systems Limited, The Wirral, UK). Densitometer readings of 50% screen images exposed by the Creo Trendsetter are shown in Table 2.

TABLE 2

| Processing | Imaging energy density (mJ/cm$^2$) | | | | | | | |
|---|---|---|---|---|---|---|---|---|
| Speed | 250 | | 205 | | 170 | | 150 | |
| (mm/min) | 500 | 1500 | 500 | 1500 | 500 | 1500 | 500 | 1500 |
| Example 1 | 34% | 65% | 38% | 72% | 78% | 98% | 100% | 99% |
| Example 2 | 29% | 60% | 32% | 64% | 31% | 64% | 47% | 79% |
| Example 3 | 27% | 62% | 30% | 66% | 34% | 73% | 42% | 81% |

| | Imaging energy density (mJ/cm$^2$) | | | |
|---|---|---|---|---|
| Processing | 130 | | 90 | |
| Speed (mm/min) | 500 | 1500 | 500 | 1500 |
| Example 1 | 100% | 100% | 100% | 100% |
| Example 2 | 80% | 95% | 100% | 100% |
| Example 3 | 80% | 98% | 98% | 98% |

The results show that the screen images formed in Example 1 have a greater area than the imaged regions formed in Example 2 or Example 3, that is, the images formed in Example 1, which do not contain any ionic liquid, are less penetrable by the developer.

Examples 4 to 8

The procedure of Example 1 was repeated except that the coating solutions containing the ingredients shown in Table 3, dissolved in toluene, were coated over the underlayer using a wire wound bar. The dry coating weight of the resulting layers was 1.0 g/m$^2$.

TABLE 3

| | Example | | | | |
|---|---|---|---|---|---|
| | 4 | 5 | 6 | 7 | 8 |
| Component | Parts by Weight | | | | |
| ACRYLOID ® A-21 | 100 | 99 | 95 | 90 | 80 |
| BMIM $PF_6$ | — | 1 | 5 | 10 | 20 |

Each of the resulting imageable elements was imaged as in Example 1 at imaging densities of 300, 246, 208, 180, 159, 142, 129 and 118 mJ/cm$^2$ (corresponding to laser power of 12 Watts and drum speeds of 90, 110, 130, 150, 170, 190, 210 and 230 rpm) and developed as in Example 1. Densitometer readings of 50% screen images are shown in Table 4.

TABLE 4

| Processing | Imaging energy density (mJ/cm$^2$) | | | | | | | |
|---|---|---|---|---|---|---|---|---|
| Speed | 300 | | 246 | | 208 | | 180 | |
| (mm/min) | 500 | 1500 | 500 | 1500 | 500 | 1500 | 500 | 1500 |
| Example 4 | 35% | 62% | 34% | 66% | 36% | 74% | 70% | 84% |
| Example 5 | 24% | 55% | 26% | 61% | 30% | 67% | 62% | 74% |
| Example 6 | 27% | 61% | 28% | 61% | 30% | 66% | 55% | 74% |
| Example 7 | — | — | 30% | 64% | 35% | 72% | 65% | 76% |
| Example 8 | 28% | 60% | 32% | 65% | 35% | 70% | 61% | 77% |

TABLE 4-continued

| Processing | Imaging energy density (mJ/cm$^2$) | | | | | | | |
|---|---|---|---|---|---|---|---|---|
| Speed | 159 | | 142 | | 129 | | 118 | |
| (mm/min) | 500 | 1500 | 500 | 1500 | 500 | 1500 | 500 | 1500 |
| Example 4 | 92% | 98% | 100% | 100% | 100% | 100% | 100% | 100% |
| Example 5 | 72% | 79% | 77% | 92% | 80% | 97% | 100% | 100% |
| Example 6 | 65% | 79% | 80% | 97% | 80% | 98% | 100% | 100% |
| Example 7 | 75% | 85% | 99% | 97% | 100% | 98% | 100% | 100% |
| Example 8 | 71% | 87% | 98% | 99% | 99% | 100% | 100% | 100% |

The results show that the screen images formed in Example 4 have a greater area than those formed in Examples 5 to 8, that is, the imaged regions formed in Example 4, which does not contain an ionic liquid, are less penetrable by the developer. The results show that 10% or 20% of the ionic liquid in the imageable composition (Examples 7 and 8) is less effective than 2% or 5% of the same ionic liquid (Examples 5 and 6).

Examples 9 to 15

The procedure of Example 1 was repeated except that the coating solutions containing the ingredients shown in Table 5, dissolved in toluene, were coated over the underlayer using a wire wound bar. The dry coating weight of the resulting layers was 1.0 g/m$^2$.

TABLE 5

| | Example | | | | | | |
|---|---|---|---|---|---|---|---|
| | 9 | 10 | 11 | 12 | 13 | 14 | 15 |
| Component | Parts by Weight | | | | | | |
| ACRYLOID ® A-21 | 100 | 98 | 95 | 98 | 95 | 98 | 95 |
| DiMIM $MeSO_4$ | — | 2 | 5 | — | — | — | — |
| EdiMIM TOS | — | — | — | 2 | 5 | — | — |
| EMI Im | — | — | — | — | — | 2 | 5 |

Each of the resulting imageable elements was imaged as in Example 1 at imaging densities of 300, 246, 208, 180, 159, 142, 129 and 118 mJ/cm$^2$ (corresponding to laser power of 12 Watts and drum speeds of 90, 110, 130, 150, 170, 190, 210 and 230 rpm) and developed as in Example 1 at a processing speed of 500 mm/min. Densitometer readings of 50% screen images are shown in Table 6.

TABLE 6

| | Imaging energy density (mJ/cm$^2$) | | | | | | | |
|---|---|---|---|---|---|---|---|---|
| | 300 | 246 | 208 | 180 | 159 | 142 | 129 | 118 |
| Example 9 | 35% | 41% | 44% | 74% | 97% | 100% | 100% | 100% |
| Example 10 | 33% | 37% | 41% | 64% | 95% | 100% | 100% | 100% |
| Example 11 | 32% | 32% | 39% | 61% | 95% | 100% | 100% | 100% |
| Example 12 | 33% | 34% | 42% | 68% | 86% | 94% | 94% | 96% |
| Example 13 | 28% | 30% | 36% | 62% | 88% | 92% | 93% | 93% |
| Example 14 | 33% | 40% | 42% | 65% | 90% | 92% | 94% | 94% |
| Example 15 | 33% | 35% | 42% | 72% | 91% | 96% | 97% | 99% |

The results show that the screen images formed in Example 9 have a greater area than those formed in Examples 10 to 15, that is, the imaged regions formed in Example 9, which does not contain an ionic liquid, are less penetrable by the developer.

Examples 16 to 18

Coating solutions were prepared by dissolving the ingredients in Table 7 in methyl ethyl ketone, methyl lactate, 1-methoxypropan-2-ol, methanol (14.6/23.6/33.2/28.6, by weight). The coating solutions were coated onto Substrate A using a wire wound bar. The resulting element, consisting of an underlayer on a support, was dried at 100° C. for 90 seconds in a Mathis Labdryer oven. The dry coating weight of the resulting underlayer was 1.0 g/m$^2$.

TABLE 7

| Component | Parts by Weight |
|---|---|
| T71 resin | 43.3 |
| IR Dye A | 13.0 |
| Nega 107 | 42.4 |
| Phosphoric acid | 1.3 |

Coating solutions containing the ingredients shown in Table 8, dissolved in toluene, were coated over the underlayer using a wire wound bar. The resulting elements were dried at 100° C. for 90 seconds in a Mathis labdryer oven. The dry coating weight of the resulting layers was 0.5 g/m$^2$.

TABLE 8

| | Example | | |
|---|---|---|---|
| | 16 | 17 | 18 |
| Component | Parts by Weight | | |
| ACRYLOID ® A-21 | 100 | 98 | 95 |
| BMIM $PF_6$ | — | 2 | 5 |

The resulting imageable elements were imaged with a 50% screen test pattern using the Creo Trendsetter at imaging densities of 300, 246, 208, 180, 159, 142, 129 and 118 mJ/cm$^2$ (corresponding to laser power of 12 Watts and drum speeds of 90, 110, 130, 150, 170, 190, 210 and 230 rpm). The imaged elements were developed using a DN32 processor (spray-on type processor, Kodak Polychrome Graphics, Norwalk, Conn. USA) containing 956 Developer at room temperature. Images produced were read with Gretag D19C densitometer. Densitometer readings of 50% screen images are shown in Table 9.

TABLE 9

| | Imaging energy density (mJ/cm$^2$) | | | | | | | |
|---|---|---|---|---|---|---|---|---|
| | 300 | 246 | 208 | 180 | 159 | 142 | 129 | 118 |
| Example 16 | 47% | 51% | 52% | 61% | 97% | 100% | 100% | 100% |
| Example 17 | 47% | 49% | 51% | 58% | 97% | 100% | 100% | 100% |
| Example 18 | 46% | 48% | 50% | 52% | 93% | 100% | 100% | 100% |

The results show that the screen images obtained for Example 16 have a greater area than for Examples 17 and 18, that is the imaged regions formed in Example 16, which does not contain an ionic liquid, are less penetrable by the developer.

Examples 19 to 25

Coating solutions were prepared by dissolving the ingredients in Table 10 in 1-methoxypropan-2-ol. The coating solutions were coated onto Substrate A using a wire wound bar. The resulting element, consisting of an underlayer on a support, was dried at 100° C. for 90 seconds in a Mathis Labdryer oven. The dry coating weight of the resulting underlayer was 1.8 g/m$^2$.

TABLE 10

| Component | Parts by Weight |
|---|---|
| PD140 A | 90 |
| IR Dye A | 10 |

Coating solutions containing the ingredients shown in Table 11 dissolved in toluene, were coated over the underlayer using a wire wound bar. The resulting elements were dried at 100° C. for 90 seconds in a Mathis labdryer oven. The dry coating weight of the resulting layer was 1.0 g/m$^2$.

TABLE 11

| | Example | | | | | | |
|---|---|---|---|---|---|---|---|
| | 19 | 20 | 21 | 22 | 23 | 24 | 25 |
| Component | Parts by Weight | | | | | | |
| ACRYLOID ® A-21 | 100 | 98 | 95 | 98 | 95 | 98 | 98 |
| BMIM $OcSO_4$ | | 2 | 5 | | | | |
| BMIM $BF_4$ | | | | 2 | 5 | | |
| OMIM $MDEGSO_4$ | | | | | | 2 | |
| OMIM $BF_4$ | | | | | | | 2 |

The resulting imageable elements were imaged with a 50% screen test pattern using the Creo Trendsetter at imaging densities of 331, 248, 198, 165, 142, 124, 110 and 99 mJ/cm$^2$ (corresponding to laser power of 11 Watts and drum speeds of 75, 100, 125, 150, 175, 200, 225 and 250 rpm). The imaged elements were then developed using a Mercury Mark V processor (Kodak Polychrome Graphics, Norwalk, Conn., USA) containing Goldstamm Developer at 23.8° C. The plates were processed at speeds of 500 and 1500 mm/min. Images produced were read with Gretag D19C densitometer. Densitometer readings of 50% screen images are shown in Table 12.

Example 26

The procedure of Examples 19–25 was repeated, except that a coating solution containing 98 parts by weight ACRYLOID® A-21 and 2 parts by weight diocyl phthalate in toluene was used to prepared the top layer. The dry coating weight of the top layer was 1.0 g/m$^2$. The resulting imageable elements were imaged and developed as in Examples 19–25. The results are given in Table 12.

TABLE 12

| Processing | Imaging energy density (mJ/cm$^2$) | | | | | | | |
|---|---|---|---|---|---|---|---|---|
| Speed | 331 | | 248 | | 198 | | 165 | |
| (mm/min) | 500 | 1500 | 500 | 1500 | 500 | 1500 | 500 | 1500 |
| Example 19 | 32% | 68% | 33% | 71% | 40% | 83% | 70% | 99% |
| Example 20 | 25% | 65% | 30% | 72% | 41% | 75% | 65% | 87% |
| Example 21 | 22% | 61% | 27% | 68% | 32% | 74% | 56% | 86% |
| Example 22 | 22% | 67% | 27% | 72% | 40% | 78% | 63% | 89% |
| Example 23 | 21% | 65% | 28% | 71% | 40% | 74% | 62% | 83% |
| Example 24 | 28% | 64% | 31% | 70% | 40% | 76% | 66% | 83% |
| Example 25 | 29% | 59% | 30% | 64% | 37% | 68% | 46% | 83% |
| Example 26 | 28% | 65% | 32% | 70% | 39% | 79% | 68% | 90% |
| Processing | Imaging energy density (mJ/cm$^2$) | | | | | | | |
| Speed | 142 | | 124 | | 110 | | 99 | |
| (mm/min) | 500 | 1500 | 500 | 1500 | 500 | 1500 | 500 | 1500 |
| Example 19 | 100% | 100% | 100% | 100% | 100% | 100% | 100% | 100% |
| Example 20 | 97% | 98% | 100% | 100% | 100% | 100% | 100% | 100% |

TABLE 12-continued

| | | | | | | | | |
|---|---|---|---|---|---|---|---|---|
| Example 21 | 90% | 99% | 97% | 100% | 98% | 100% | 98% | 100% |
| Example 22 | 96% | 96% | 100% | 100% | 100% | 100% | 100% | 100% |
| Example 23 | 86% | 96% | 100% | 100% | 100% | 100% | 100% | 100% |
| Example 24 | 95% | 96% | 100% | 100% | 100% | 100% | 100% | 100% |
| Example 25 | 98% | 99% | 100% | 100% | 100% | 100% | 100% | 100% |
| Example 26 | 97% | 98% | 98% | 100% | 100% | 100% | 100% | 100% |

The results generally show that the screen images obtained for Example 19 have a greater area than for Examples 20–25, indicating that imaged regions formed in Example 19 are less penetrable by the developer.

Having described the invention, we now claim the following and their equivalents.

What is claimed is:

1. An imageable element comprising:

a substrate;

an underlayer over the substrate;

a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the top layer comprises a binder and an ionic liquid;

the binder is selected from the group consisting of poly(methyl methacrylate); copolymers of methyl methacrylate with other acrylate or methacrylate monomers; polystyrene; copolymers of styrene with acrylate and methacrylate monomers; polyesters, polyamides, polyureas, polyurethanes, epoxy resins, and combinations thereof;

the underlayer is removable by the alkaline developer; and the ionic liquid has a melting point less than 50° C.

2. The imageable element of claim 1 in which the binder is selected from the group consisting of poly(methyl methacrylate); copolymers of methyl methacrylate with other acrylate or methacrylate monomers; polystyrene; and copolymers of styrene with acrylate and methacrylate monomers.

3. The element of claim 2 in which the binder is poly(methyl methacrylate).

4. The element of claim 3 in which the ionic liquid comprises an imidazolium cation.

5. The element of claim 2 in which the underlayer comprises the photothermal conversion material.

6. The element of claim 3 in which:

the element additionally comprises an absorber layer between the underlayer and the top layer; and the absorber layer comprises the photothermal conversion material.

7. The element of claim 1 in which the top layer comprises about 1 wt % to about 20 wt % of the ionic liquid, based on the dry weight of the top layer.

8. The element of claim 7 in which the binder is poly(methyl methacrylate).

9. The element of claim 4 in which the ionic liquid has a melting point of less than 20° C.

10. The element of claim 1 in which the ionic liquid comprises a cation selected from the group consisting of imidazolium cations, pyridinium cations, pyrrolidinium cations, phosphonium cations, and tetralkylammonium cations.

11. The element of claim 10 in which the ionic liquid has a melting point of less than 20° C.

12. The element of claim 5 in which the ionic liquid has a melting point of less than 20° C.

13. The element of claim 12 in which the binder is poly(methyl methacrylate).

14. The element of claim 13 in which the ionic liquid comprises an imidazolium cation.

15. A method for forming an image, the method comprising the steps of:

a) thermally imaging an imageable element and forming an imaged imageable element comprising imaged and complementary unimaged regions;

the imageable element comprising:

a substrate;

an underlayer over the substrate;

a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the top layer comprises a binder and an ionic liquid;

the binder is selected from the group consisting of poly(methyl methacrylate); copolymers of methyl methacrylate with other acrylate or methacrylate monomers; polystyrene; copolymers of styrene with acrylate and methacrylate monomers; polyesters, polyamides, polyureas, polyurethanes, epoxy resins, and combinations thereof;

the underlayer is removable by the alkaline developer; and the ionic liquid has a melting point less than 50° C.; and b) developing the imaged imageable element with the alkaline developer and removing the imaged regions without substantially affecting the unimaged regions.

16. The method of claim 15 in which the binder is poly(methyl methacrylate).

17. The method of claim 16 in which the alkaline developer is an aqueous alkaline developer.

18. The method of claim 16 in which the alkaline developer is a solvent based developer.

19. The method of claim 18 in which the ionic liquid has a melting point of less than 20° C.

20. The method of claim 19 in which the ionic liquid comprises an imidazolium cation.

21. The element of claim 1 in which the ionic liquid has a melting point of less than 0° C.

22. The method of claim 15 in which the ionic liquid has a melting point of less than 0° C.

23. The element of claim 3 in which the ionic liquid has a melting point of less than 0° C.

24. The method of claim 15 in which the binder is selected from the group consisting of poly(methyl methacrylate); copolymers of methyl methacrylate with other acrylate or methacrylate monomers; polystyrene; and copolymers of styrene with acrylate and methacrylate monomers.

* * * * *